United States Patent
Kim et al.

(10) Patent No.: US 7,646,014 B2
(45) Date of Patent: Jan. 12, 2010

(54) ORGANIC THIN FILM TRANSISTOR COMPRISING FLUORINE-BASED POLYMER THIN FILM AND METHOD FOR FABRICATING THE SAME

(75) Inventors: Joo Young Kim, Suwon-si (KR); Bon Won Koo, Suwon-si (KR); Eun Kyung Lee, Seoul (KR); Sang Yoon Lee, Seoul (KR); Bang Lin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 344 days.

(21) Appl. No.: 11/606,287

(22) Filed: Nov. 30, 2006

(65) Prior Publication Data

US 2007/0194305 A1   Aug. 23, 2007

(30) Foreign Application Priority Data

Feb. 21, 2006   (KR) .................... 10-2006-0016705

(51) Int. Cl.
  *H01L 35/24* (2006.01)
(52) U.S. Cl. .......... 257/40; 257/E51.006; 257/E51.027; 438/99
(58) Field of Classification Search .................. 257/40, 257/E51.027, E51.006; 439/99
  See application file for complete search history.

(56) References Cited

U.S. PATENT DOCUMENTS

| | | | |
|---|---|---|---|
| 5,981,970 A | 11/1999 | Dimitrakopoulos et al. | |
| 6,232,157 B1 | 5/2001 | Dodabalapur et al. | |
| 6,558,987 B2 | 5/2003 | Lee | |
| 6,563,174 B2 | 5/2003 | Kawasaki et al. | |
| 7,202,495 B2 * | 4/2007 | Unno | 257/40 |
| 7,282,735 B2 * | 10/2007 | Wu et al. | 257/40 |
| 7,364,940 B2 * | 4/2008 | Kim et al. | 438/99 |
| 2004/0222412 A1 * | 11/2004 | Bai et al. | 257/40 |
| 2005/0287697 A1 * | 12/2005 | Unno et al. | 438/99 |
| 2006/0151781 A1 * | 7/2006 | Kim et al. | 257/40 |

OTHER PUBLICATIONS

Y.Y. Lin et al. "High-Mobility Pentacene Organic Thin Film Transistors". 54th Annual Device Research Conference Digest, 1996, pp. 80-81.

C.D. Dimitrakopoulos et al. "Low-Voltage Organic Transistors on Plastic Comprising High-Dielectric Constant Gate Insulators". Science, vol. 283, Feb. 5, 1999, pp. 822-824.

* cited by examiner

*Primary Examiner*—M. Wilczewski
*Assistant Examiner*—Telly D Green
(74) *Attorney, Agent, or Firm*—Harness, Dickey & Pierce, P.L.C.

(57) ABSTRACT

Disclosed is an organic thin film transistor, including a substrate, a gate electrode, a gate insulating layer, an organic semiconductor layer, and source/drain electrodes, in which a fluorine-based polymer thin film is provided between the source/drain electrodes and the organic semiconductor layer. A method of fabricating such an organic thin film transistor is also provided. According to example embodiments, the organic thin film transistor may have increased charge mobility and an $I_{on}/I_{off}$ ratio, due to decreased contact resistance between the source/drain electrodes and the organic semiconductor layer. Moreover, upon the formation of the organic semiconductor layer and insulating film, a wet process may be more easily applied, thus simplifying the fabrication process and decreasing the fabrication cost.

12 Claims, 2 Drawing Sheets

FIG. 5

ORGANIC THIN FILM TRANSISTOR COMPRISING FLUORINE-BASED POLYMER THIN FILM AND METHOD FOR FABRICATING THE SAME

PRIORITY STATEMENT

This non-provisional application claims priority under 35 U.S.C. § 119 to Korean Patent Application No. 10-2006-0016705, filed on Feb. 21, 2006, in the Korean Intellectual Property Office (KIPO), the entire contents of which are incorporated herein by reference.

BACKGROUND

1. Field

Example embodiments relate to an organic thin film transistor (OTFT) including a fluorine-based polymer thin film and a method of fabricating the same. Other example embodiments relate to an OTFT, including a substrate, a gate electrode, a gate insulating layer, an organic semiconductor layer, and source/drain electrodes, in which a fluorine-based polymer thin film is between the source/drain electrodes and the organic semiconductor layer and a method of fabricating the same.

2. Description of the Related Art

Thin film transistors (TFTs) presently used in displays may be composed mainly of an amorphous silicon semiconductor, a silicon oxide insulating film, and a metal electrode. However, with the recent development of various conductive organic materials, research into OTFTs using organic semiconductors is being conducted all over the world. The OTFT, which was first invented in the 1980s, may be advantageous because it is flexible and may be more easily processed and fabricated, and thus is under study these days for application to display devices, e.g., E-Ink, organic EL and/or LCD.

Because the organic semiconductor, regarded as a novel electronic material, has advantages (e.g., numerous polymer synthesis methods, easier formability into fibers or films, flexibility and/or decreased preparation costs), it is widely applied to functional electronic devices and optical devices. Accordingly, in the OTFT, an organic semiconductor layer may be formed not of amorphous Si but of conductive polymer, and may be thus used as the organic semiconductor of a transistor. Compared to conventional silicon transistors, such an OTFT may be advantageous because the semiconductor layer may be formed through a printing process at atmospheric pressure instead of through CVD using plasma, and all of the fabrication processes may be carried out using a roll-to-roll process on a plastic substrate, if necessary, thus decreasing the cost of fabricating the transistor.

However, the OTFT is disadvantageous because it has decreased charge mobility and increased operating voltage and threshold voltage compared with amorphous silicon TFTS. Charge mobility may be increased to a level of about $0.6 \text{ cm}^2 \cdot \text{V}^{-1} \cdot \text{sec}^{-1}$ using pentacene, thus increasing the probability of realizing an OTFT in practice. However, charge mobility may still be unsatisfactory, and an operating voltage of about 100 V or more and a sub-threshold voltage corresponding to at least 50 times the voltage of an amorphous silicon TFT may be required.

In other conventional art, there is an OTFT in which an operating voltage and a threshold voltage are decreased using a high-k insulating film. The gate insulating layer may be formed of inorganic metal oxide, e.g., $Ba_xSr_{1-x}TiO_3$ (BST; Barium Strontium Titanate), $Ta_2O_5$, $Y_2O_3$ and/or $TiO_2$, and/or a ferromagnetic insulator, e.g., $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$ and/or $Bi_4Ti_3O_{12}$. A gate insulating layer may be formed through CVD, PVD, sputtering and/or sol-gel coating, and may have a k of about 15 or more.

Although the operating voltage of the OTFT is decreased to about −5 V, charge mobility thereof may not be higher than about $0.6 \text{ cm}^2 \cdot \text{V}^{-1} \cdot \text{sec}^{-1}$, which is still unsatisfactory. Almost all of the fabrication processes require an increased temperature of about 200° C.~about 400° C., thus various substrates may not be applied. A general wet process, e.g., simple coating and/or printing, may be difficult to use upon the fabrication of the device.

In other conventional art, there may be an organic insulating film formed of polyimide, benzocyclobutene, or polyacryl. However, the organic insulating film may not exhibit the device properties suitable for substituting for an inorganic insulating film.

With the goal of improving the performance of thin film electronic devices, attempts to use a multilayered gate insulating film having two or more layers have been made. In this regard, a multilayered gate insulating film composed of amorphous silicon nitride and silicon oxide, and a double-layer insulating film may use the same materials as above. Thereby, the electrical insulating properties and crystal quality of the semiconductor layer may increase.

However, the above-mentioned are limited only to inorganic TFTs using amorphous silicon or monocrystal silicon, and may be more difficult to apply to organic semiconductors due to the use of inorganic material.

Recently, application of the OTFT to various devices, including not only LCDs but also devices for driving flexible displays using organic EL, has been attempted. The OTFT may have charge mobility not lower than about $5 \text{ cm}^2 \cdot \text{V}^{-1} \cdot \text{sec}^{-1}$, decreased operating voltage and threshold voltage, and improved insulating properties of the insulating film. Especially, the fabrication thereof may be required to be conducted in the all-printing or all-spin on manner on a plastic substrate, in order to simplify the process and reduce the cost.

Accordingly, research into methods of forming an organic gate insulating layer through a simpler process and of increasing charge mobility between the organic gate insulating layer and the organic semiconductor layer thereon has been actively conducted, but there are no satisfactory alternatives. Consequently, the development of an OTFT having a novel structure, which is characterized by ensuring increased charge mobility, having improved electrical insulating properties, lower operating voltage and threshold voltage, and forming an insulating film through a typical wet process, is required.

Moreover, the OTFT may be fabricated to have various structures. However, among these structures, a top contact type OTFT may be undesirable because channel resistance is problematic. A bottom contact type or top gate type OTFT may be undesirable because it has increased contact resistance between source/drain electrodes and an organic semiconductor layer, in addition to the problem of the channel resistance, undesirably deteriorating the performance of the OTFT.

SUMMARY

Example embodiments provide OTFTs using polymer semiconductors able to be subjected to a wet process with a fluorine-based polymer that material may be applied between source/drain electrodes and an organic semiconductor layer to form a fluorine-based polymer thin film, thereby decreasing the contact resistance therebetween, leading to improved charge mobility and $I_{on}/I_{off}$ ratio.

Accordingly, example embodiments provide an OTFT including a substrate, a gate electrode, a gate insulating layer, an organic semiconductor layer, source/drain electrodes, and a fluorine-based polymer thin film, which is provided between the source/drain electrodes and the organic semiconductor layer.

Example embodiments provide a method of fabricating an OTFT including a gate electrode, a gate insulating layer, an organic semiconductor layer, source/drain electrodes, and a fluorine-based polymer thin film, the method including forming a fluorine-based polymer thin film between the source/drain electrodes and the organic semiconductor layer.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these example embodiments are provided so that this disclosure will be thorough and complete, and will fully convey the scope of example embodiments to those skilled in the art. In the drawings, the thicknesses of layers and regions are exaggerated for clarity. Like reference numbers refer to like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments provide an OTFT that may include a substrate, a gate electrode, a gate insulating layer, an organic semiconductor layer, source/drain electrodes, and a fluorine-based polymer thin film, which may be formed between the source/drain electrodes and the organic semiconductor layer. The OTFT according to example embodiments may have a bottom contact type structure or a top gate type structure.

The OTFT of example embodiments may be a bottom contact type OTFT, which includes a substrate on which a gate electrode may be positioned, a gate insulating layer positioned on the gate electrode, source/drain electrodes positioned on the gate insulating layer, a fluorine-based polymer thin film, and a polymer semiconductor, acting as an organic semiconductor layer, formed on the fluorine-based polymer thin film.

The OTFT of example embodiments may be a top gate type OTFT, which includes a substrate on which source/drain electrodes may be formed, source/drain electrodes, a fluorine-based polymer thin film, a polymer semiconductor acting as an organic semiconductor layer formed on the fluorine-based polymer thin film, a gate insulating layer positioned on the organic semiconductor layer, and a gate.

Figure 1:
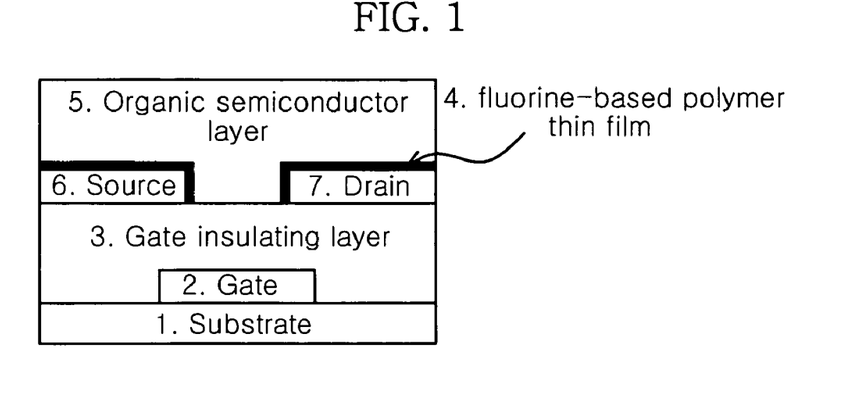
FIG. 1 is a diagram illustrating the bottom contact type OTFT according to example embodiments.
Figure 3:
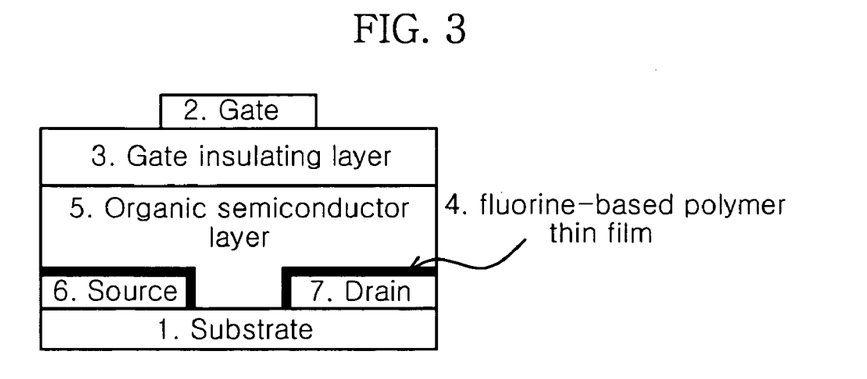
FIG. 3 is a diagram illustrating the top gate type OTFT according to example embodiments.

The diagrams of the OTFTs according to example embodiments are shown in FIGS. 1 and 3. As such, the bottom contact type OTFT and the top gate type OTFT are depicted in FIGS. 1 and 3, respectively, and they may have structures modified within a range that does not inhibit the purpose of example embodiments.

In the OTFT of example embodiments, the substrate 1 may be formed of glass, silicon and/or plastic, but example embodiments are not limited thereto. In the OTFT of example embodiments, the gate electrode 2, the source electrode 6, and the drain electrode 7 may be formed of typical metals or conductive polymers or copolymers, examples thereof including, but not being limited to, gold (Au), silver (Ag), aluminum (Al), nickel (Ni), molybdenum (Mo), tungsten (W), indium tin oxide (ITO), polythiophene, polyaniline, polyacetylene, polypyrrole, polyphenylenevinylene and/or a mixture of PEDOT (polyethylenedioxythiophene) and PSS (polystyrenesulfonate).

In the OTFT of example embodiments, the gate insulating layer 3 may be formed of typical organic and/or inorganic compounds. Examples of such organic compounds include polyvinylphenol, polymethylmethacrylate, polyacrylate and/or polyvinylalcohol, and examples of inorganic compounds include $SiN_x$ (0<x<4), $SiO_2$ and/or $Al_2O_3$. A polyvinylphenyl copolymer mixed with a crosslinking agent and an organic-inorganic hybrid insulator may be used.

The gate insulating layer 3 may be formed through a general wet process, e.g., dip coating, spin coating, printing, spray coating and/or roll coating. The thickness of the gate insulating layer 3 may be appropriately adjusted, if necessary. In consideration of the subsequently applied fluorine-based polymer thin film, the gate insulating layer 3 may have a thickness of about 3000~7000 Å.

In the OTFT of example embodiments, the fluorine-based polymer thin film 4, which is provided between the organic semiconductor layer 5 and the gate insulating layer 3, may be formed of a polymer having a repeating unit in which a ratio of carbon atom to fluorine atom on the main chain or side chain thereof is about 5:1~about 30:1. Specifically, such a polymer may include at least one repeating unit selected from the group consisting of repeating units represented by Formulas 1 and 2 below, the ratio of carbon atom to fluorine atom on the main chain or side chain of the polymer ranging from about 5:1 to about 30:1.

If the ratio of carbon atom to fluorine atom exceeds about 30:1, the desired purpose may not be achieved. On the other hand, if the ratio is less than 5:1, it may be difficult to form the insulator or polymer semiconductor material on the fluorine-based polymer film.

Formula 1 wherein X is a hydrogen atom, a $C_1$~$C_{14}$ linear or branched alkyl group, a fluorine atom, or a chlorine atom, and R is represented by Formula 3 below.

Formula 2 wherein X is a hydrogen atom, a $C_1$~$C_{14}$ linear or branched alkyl group, a fluorine atom, or a chlorine atom, Y is an oxygen atom or a $C_2$~$C_{14}$ alkylene group, and R is represented by Formula 3 below.

Formula 3 wherein $R_1$ is selected from the group consisting of functional groups represented by Formula 4 below, $R_2$ is selected from the group consisting of functional groups represented by Formula 5 below, $R_3$ is selected from the group consisting of functional groups represented by Formula 6 below, k is an integer from 1 to 3, and l is an integer from 0 to 5, $R_1$ and $R_2$ being different from each other when $R_1$ and $R_2$ are provided in plural numbers.

Formula 4 wherein n is an integer from 0 to 10.

Formula 5

Formula 6 wherein X should have at least one fluorine atom, X is H, F, $CF_3$, $CHF_2$, $CH_2F$, $OCF_3$, $OCHF_2$ or $OCH_2F$, and m is an integer from 0 to 18.

In order to improve the electrical properties of the insulating layer, the fluorine-based polymer material used in example embodiments may be characterized in that a fluorine atom is introduced to the main chain or side chain of the polymer, thus controlling the ratio of carbon atom to fluorine atom in the repeating unit of the polymer. The fluorine-based polymer material may be a polymer, a copolymer or higher order polymer and mixtures thereof.

When the fluorine-based polymer itself is used as an insulator, the properties may be negligibly improved. However, when the fluorine-based polymer is applied in the form of a thin film between the gate insulating layer and the organic active film, increased charge mobility and an increased $I_{on}/I_{off}$ ratio may result, although the mechanism thereof has not yet been accurately determined.

Specific examples of the fluorine-based polymer include compounds represented by Formulas 7 and 8 below:

Formula 7

Formula 8

In example embodiments, the fluorine-based polymer thin film 4 may be formed using any one of general wet coating processes, and may be formed to a thickness of about 10 Å ~ about 100 Å using a spin coating process. When the thin film is thicker than about 100 Å, electrical charge may not flow due to higher insulator properties. On the other hand, if the thin film is thinner than about 10 Å, the fluorinated side chain may not migrate into the surface effectively, or the reduction of the channel resistance may be unsatisfactory. Examples of the process of forming the fluorine-based polymer thin film 4 may include, but are not limited to, wet processes, e.g., spin coating, dip coating, printing, ink jetting and/or roll coating.

The OTFT including the fluorine-based polymer thin film of example embodiments may have charge mobility and an $I_{on}/I_{off}$ ratio improved compared to conventional OTFTs having general polymer semiconductors. While the gate insulating layer, the fluorine-based polymer thin film and the organic semiconductor layer of the OTFT of example embodiments may be formed using a typical wet process, e.g., printing and/or spin coating, the performance thereof may correspond to that of an amorphous silicon TFT, which may only be created using a complicated process, e.g., CVD.

In the OTFT of example embodiments, the organic semiconductor layer 5 may be formed of any known polymer material based on a polythiophene derivative that may be subjected to a wet process. Examples of such material may include polythiophene, polyaniline, polyacetylene, polypyrrole, polyphenylenevinylene and/or derivatives thereof. As such, the organic semiconductor layer may be formed through screen printing, printing, spin coating, dip coating and/or ink jetting, but example embodiments may not be limited thereto.

Figure 2:
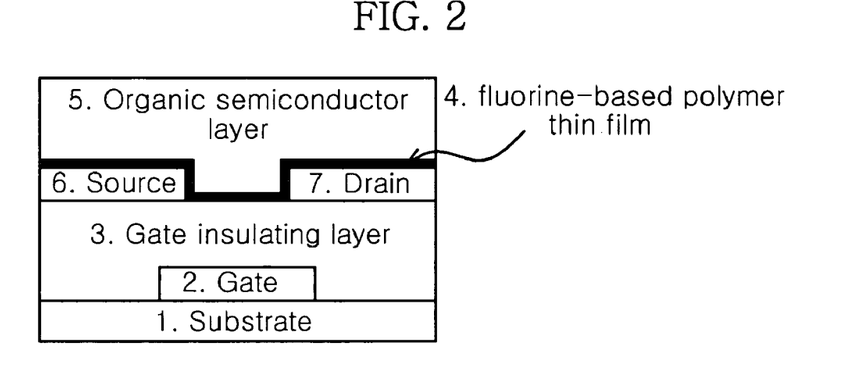
FIG. 2 is a diagram illustrating the bottom contact type OTFT according to the modification of example embodiments.

The OTFT of example embodiments, for example, the bottom contact type OTFT, as shown in FIG. 2, may further include a fluorine-based polymer thin film 4 formed between the gate insulating layer 3 and the organic semiconductor layer 5, as well as the fluorine-based polymer thin film formed between the source/drain electrodes 6, 7 and the organic semiconductor layer 5.

Figure 4:
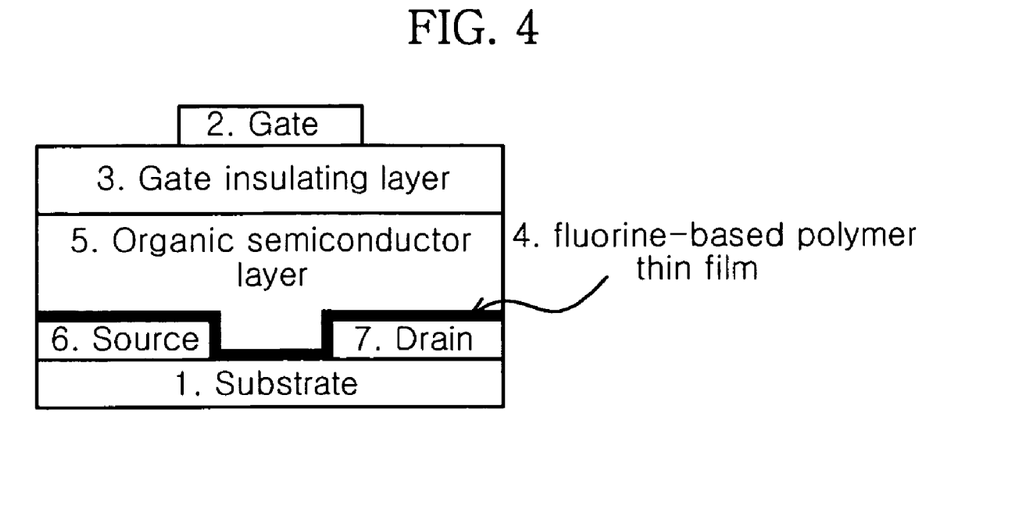
FIG. 4 is a diagram illustrating the top gate type OTFT according to the modification of example embodiments.

Also, the top gate type OTFT, as shown in FIG. 4, may further include a fluorine-based polymer thin film 4 formed between the substrate 1 and the organic semiconductor layer 5, as well as the fluorine-based polymer thin film formed between the source/drain electrodes 6, 7 and the organic semiconductor layer 5.

In the OTFTs having structures as in FIGS. 3 and 4, the contact resistance and channel resistance may be decreased, thereby improving electrical properties, e.g., charge mobility and the $I_{on}/I_{off}$ ratio.

Example embodiments provide a method of fabricating an OTFT including a gate electrode, a gate insulating layer, an organic semiconductor layer, source/drain electrodes, and a fluorine-based polymer thin film, the method including applying a fluorine-based polymer compound between the source/drain electrodes and the organic semiconductor layer to form the fluorine-based polymer thin film therebetween.

The bottom contact type OTFT may be fabricated by 1) forming a gate electrode on a substrate, 2) forming a gate insulating layer on the gate electrode, 3) forming source/drain electrodes on the gate insulating layer, 4) applying a fluorine-based polymer compound on the source/drain electrodes to form a fluorine-based polymer thin film, and 5) forming an organic semiconductor layer on the fluorine-based polymer thin film.

The top gate type OTFT may be fabricated by 1) forming source/drain electrodes on a substrate, 2) applying a fluorine-based polymer compound on the source/drain electrodes to form a fluorine-based polymer thin film, 3) forming an organic semiconductor layer on the fluorine-based polymer thin film, 4) forming a gate insulating layer on the organic semiconductor layer, and 5) forming a gate on the gate insulating layer.

A better understanding of example embodiments may be obtained in light of the following examples which are set forth to illustrate, but are not to be construed to limit example embodiments.

PREPARATIVE EXAMPLE 1

Preparation of Composition for Formation of Fluorine-based Polymer Thin Film (1)

(1) Synthesis of 3,4-Difluoro-Benzoic acid 4-(2-Chlorocarbonyl-Vinyl)-Phenyl Ester

About 10 g (about 21.68 mmol) of 3,4-difluoro-benzoic acid 4-(2-carboxy-vinyl)-phenyl ester was dissolved in about 200 ml of methylene chloride, and about 2.84 g (23.848 mmol) of thionyl chloride (SOCl$_2$) was added thereto. Thereafter, the reaction mixture was stirred at about 35° C. for about 6 hours, followed by removing the solvent. Subsequently, a vacuum drying process was conducted, thus obtaining the desired compound (Yield about 90%).

(2) Synthesis of Maleimide-Styrene Copolymer Derivative

About 2.74 g (about 9.033 mmol) of Polyhydroxymaleimide-polyhydroxystyrene was dissolved in about 50 ml of N-methylpyrrolidone (NMP), cooled to about 0° C., added with about 3.291 g (32.52 mmol) of triethylamine (Et$_3$N), and then stirred for about 30 min. Subsequently, about 6.995 g (about 21.679 mmol) of the (1) 3,4-Difluoro-benzoic acid 4-(2-chlorocarbonyl-vinyl)-phenyl ester was added to the stirred solution and then stirred at room temperature for about 4 hours.

The stirred reaction solution was poured on water and ethanol, and the resultant solid was filtered, washed several times with water, and vacuum dried, thus obtaining the desired compound (Yield about 60%).

As such, the above reaction procedure is represented by Reaction Scheme 1 below:

PREPARATIVE EXAMPLE 2

Preparation of Composition for Formation of Fluorine-based Polymer Thin Film (2)

(1) Synthesis of 4-[6-(3,4,5-Trifluoro-Phenoxy)-Hexyloxy]-Benzoic acid

About 2.75 g of 4-[6-(3,4,5-Trifluoro-phenoxy)-hexyloxy]-benzoic acid ethyl ester was dissolved in about 100 ml of 1,4-dioxolane, and added with about 100 ml of about 1.0 M NaOH solution, after which the reaction mixture was stirred for one day.

The stirred solution was acidified using an about 10% HCl solution, after which the resultant solid was filtered and then recrystallized using ethanol, thus obtaining 4-[6-(3,4,5-trifluoro-phenoxy)-hexyloxy]-benzoic acid (Yield about 62%).

(2) Synthesis of 4-[6-(3,4,5-Trifluoro-Phenoxy)-Hexyloxy]-Benzoyl Chloride

About 10 g (about 27.148 mmol) of 4-[6-(3,4,5-Trifluoro-phenoxy)-hexyloxy]-benzoic acid was dissolved in about 200 ml of methylene chloride, and then added with about 3.55 g (about 29.862 mmol) of thionyl chloride. The reaction mixture was stirred at about 35° C. for about 6 hours, and the solvent was removed. Through a vacuum drying process, the desired compound was obtained (Yield about 95%).

(3) Synthesis of Maleimide-Styrene Copolymer Derivative

About 2.74 g (about 9.033 mmol) of Polyhydroxymaleimide-polyhydroxystyrene was dissolved in about 50 ml of NMP, cooled to about 0° C., added with about 3.291 g (about 32.52 mmol) of $Et_3N$, and then stirred for about 30 min. Subsequently, the stirred solution was added with about 8.385 g (21.679 mmol) of the (2) 4-[6-(3,4,5-trifluoro-phenoxy)-hexyloxy]-benzoyl chloride and then stirred at room temperature for about 4 hours.

The stirred reaction solution was poured on water and methanol, and the resultant solid was filtered, washed several times with water, and vacuum dried, thus obtaining the desired compound (Yield about 71%).

As such, the above reaction procedure is represented by Reaction Scheme 2 below:

EXAMPLE 1

On a glass substrate having an Al gate electrode formed thereon, an organic insulator composition including a blend of a polyvinylphenyl copolymer and an acrylic crosslinking agent was applied through spin coating to form an insulating layer having a thickness of about 7000 Å, which was then subjected to baking at about 100° C. for about 1 hour in a nitrogen atmosphere, thus forming a gate insulating layer having a final thickness of about 6000 Å.

Gold (Au) source/drain electrodes were formed on the gate insulating layer through a bottom contact process using a shadow mask having a channel length of about 100 μm and a channel width of about 1 mm. Thereafter, the composition of Preparative Example 1 was dissolved to about 0.5 wt % in cyclohexanone, and the solution thus obtained was then applied on the source/drain electrodes through spin coating at about 3000 rpm, to form a fluorine-based polymer thin film about 80 Å thick, which was then cured at about 150° C. for about 10 min.

Subsequently, a polythiophene derivative as a polymer semiconductor material was applied on the fluorine-based polymer thin film through spin coating in a nitrogen atmosphere to form an organic semiconductor layer about 500 Å thick, thereby fabricating an OTFT.

The charge mobility, threshold voltage, and $I_{on}/I_{off}$ ratio of the OTFT thus fabricated were measured as follows. The results are shown in Table 1 below.

Charge Mobility and Threshold Voltage

The charge mobility was calculated using the following current equation for the saturation region. The current equation for the saturation region was converted into a graph of $(I_{SD})^{1/2}$ to $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, μ or $\mu_{FET}$ is charge mobility, $C_o$ is oxide film capacitance, W is the channel width, L is the channel length, $V_G$ is the gate voltage, and $V_T$ is the threshold voltage.

The $I_{on}/I_{off}$ ratio was determined from the ratio of maximum or increased current in the on-state to minimum or decreased current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$ is maximum current, $I_{off}$ is off-state leakage current, μ is charge mobility, σ is the conductivity of the thin film, q is the quantity of electric charge, $N_A$ is the density of electric charge, t is the thickness of the semiconductor film, $C_o$ is the capacitance of the insulating film, and $V_D$ is the drain voltage.

Because the $I_{on}/I_{off}$ ratio increases when a high-k dielectric film is thin, the type and thickness of the dielectric film are important in determining the $I_{on}/I_{off}$ ratio. The cut-off leakage current ($I_{off}$), which is the current flowing in the off-state, was determined to be the minimum or decreased current in the off-state.

Figure 5:
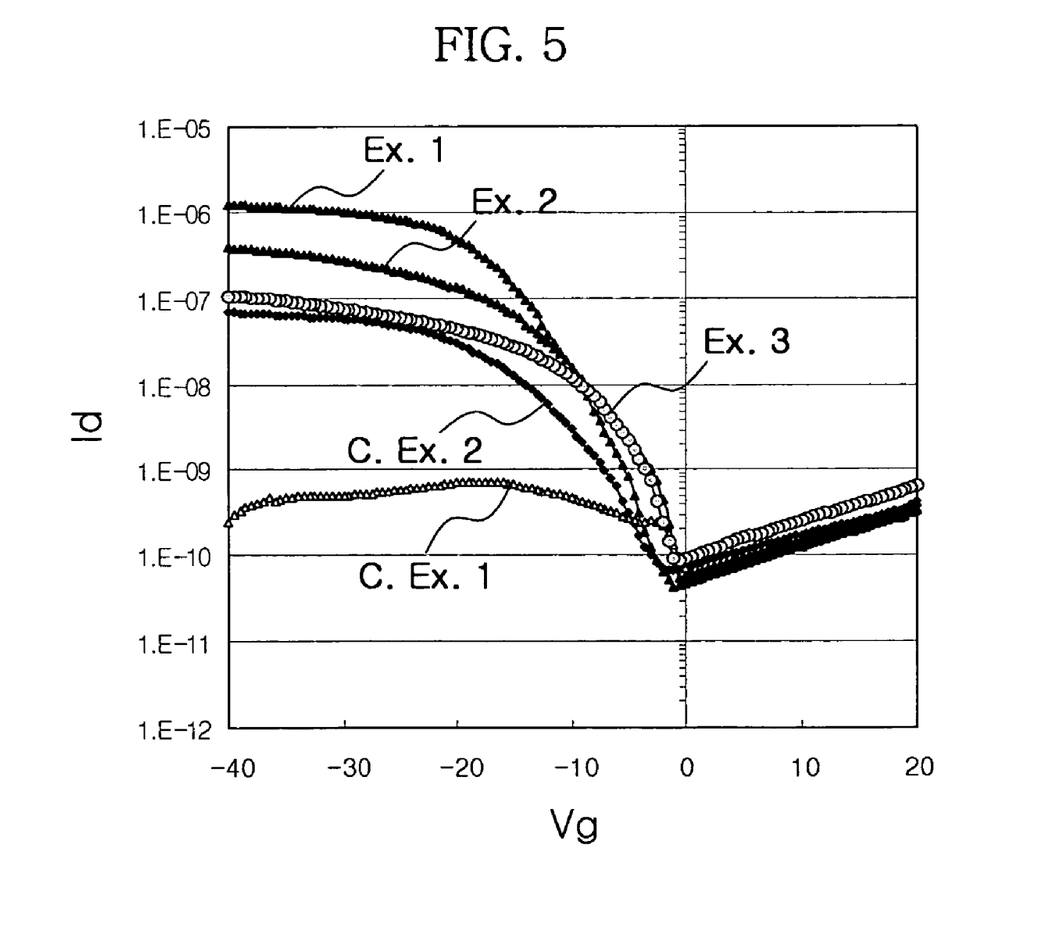
FIG. 5 is a graph illustrating the current transfer properties of the OTFTs of Examples 1 to 3 and Comparative Examples 1 and 2.

The current transistor properties of the above OTFT are shown in FIG. 5, in which the variation of $I_{SD}$ to $V_G$ is depicted upon the increase of the effective k.

EXAMPLE 2

An OTFT was fabricated in the same manner as in Example 1, with the exception that the composition of Preparative Example 1 was dissolved to about 0.25 wt % in cyclohexanone and the fluorine-based polymer thin film was formed to be about 50 Å thick. The charge mobility, threshold voltage, and $I_{on}/I_{off}$ ratio of the OTFT thus fabricated were measured as in Example 1. The results are shown in Table 1 below.

The current transistor properties of the above OTFT are shown in FIG. 5.

EXAMPLE 3

An OTFT was fabricated in the same manner as in Example 1, with the exception that the composition of Preparative Example 1 was dissolved to about 0.1 wt % in cyclohexanone and the fluorine-based polymer thin film was formed to be about 20 Å thick. The charge mobility, threshold voltage, and $I_{on}/I_{off}$ ratio of the OTFT thus fabricated were measured as in Example 1. The results are shown in Table 1 below.

The current transistor properties of the above OTFT are shown in FIG. 5.

COMPARATIVE EXAMPLE 1

An OTFT was fabricated in the same manner as in Example 1, with the exception that the composition of Preparative Example 1 was dissolved to about 1.0 wt % in cyclohexanone and the fluorine-based polymer thin film was formed to be about 200 Å thick. The charge mobility, threshold voltage, and $I_{on}/I_{off}$ ratio of the OTFT thus fabricated were measured as in Example 1. The results are shown in Table 1 below.

The current transistor properties of the above OTFT are shown in FIG. 5.

COMPARATIVE EXAMPLE 2

An OTFT was fabricated in the same manner as in Example 1, with the exception that the fluorine-based polymer thin film was not formed. The charge mobility, threshold voltage, and $I_{on}/I_{off}$ ratio of the OTFT thus fabricated were measured as in Example 1. The results are shown in Table 1 below.

The current transistor properties of the above OTFT are shown in FIG. 5.

TABLE 1

| No. | Charge Mobility | $I_{on}/I_{off}$ (cm$^2$/Vs) |
|---|---|---|
| Ex. 1 | 0.12 | $2.9 \times 10^4$ |
| Ex. 2 | 0.02 | $7.1 \times 10^3$ |
| Ex. 3 | 0.005 | $1.2 \times 10^3$ |
| C. Ex. 1 | $4.0 \times 10^{-5}$ | 20 |
| C. Ex. 2 | 0.004 | $1.0 \times 10^3$ |

As is apparent from Table 1, it has been confirmed that the OTFTs according to example embodiments have improved electrical properties, including charge mobility and an $I_{on}/I_{off}$ ratio, due to the decreased contact resistance. Thus, such OTFTs may be efficiently used as transistors in various electronic devices.

As described hereinbefore, example embodiments provide an OTFT including a fluorine-based polymer thin film and a method of fabricating the same. According to example embodiments, the OTFT may have increased charge mobility and an increased $I_{on}/I_{off}$ ratio. Upon the formation of an organic semiconductor layer and an insulating film, a wet process may be easily applied, thus simplifying the fabrication process and decreasing the fabrication cost.

Although example embodiments have been disclosed for illustrative purposes, those skilled in the art will appreciate that various modifications, additions and substitutions are possible, without departing from the scope and spirit of the accompanying claims.

What is claimed is:

1. An organic thin film transistor, comprising a substrate, a gate electrode, a gate insulating layer, an organic semiconductor layer, source/drain electrodes, and a fluorine-based polymer thin film, wherein the fluorine-based polymer thin film is formed at least along an upper surface and sidewalls of the source/drain electrodes and between the organic semiconductor layer and gate insulating layer, or at least along an upper surface and sidewalls of the source/drain electrodes and between the organic semiconductor layer and the substrate.

2. The organic thin film transistor as set forth in claim 1, wherein the fluorine-based polymer thin film is formed of a polymer comprising at least one repeating unit selected from the group consisting of repeating units represented by Formulas 1 and 2 below, in which a ratio of carbon atom to fluorine atom on a main chain or side chain of the polymer ranges from about 5:1 to about 30:1:

Formula 1 wherein X is a hydrogen atom, a $C_1$~$C_{14}$ linear or branched alkyl group, a fluorine atom, or a chlorine atom, and R is represented by Formula 3 below, and

Formula 2 wherein X is a hydrogen atom, a $C_1$~$C_{14}$ linear or branched alkyl group, a fluorine atom, or a chlorine atom, Y is an oxygen atom or a $C_2$~$C_{14}$ alkylene group, and R is represented by Formula 3 below:

Formula 3 wherein $R_1$ is selected from the group consisting of functional groups represented by Formula 4 below, $R_2$ is selected from the group consisting of functional groups represented by Formula 5 below, $R_3$ is selected from the group consisting of functional groups represented by Formula 6 below, k is an integer from 1 to 3, and l is an integer from 0 to 5, $R_1$ and $R_2$ being different from each other when $R_1$ and $R_2$ are provided in plural numbers;

Formula 4 wherein n is an integer from 0 to 10;

Formula 5

-continued

Formula 6 wherein X includes at least one fluorine atom and is H, F, CF$_3$, CHF$_2$, CH$_2$F, OCF$_3$, OCHF$_2$ or OCH$_2$F, and m is an integer from 0 to 18.

3. The organic thin film transistor as set forth in claim 2, wherein the fluorine-based polymer thin film is formed of a compound represented by Formula 7 or 8 below:

Formula 7

Formula 8

4. The organic thin film transistor as set forth in claim 1, wherein the fluorine-based polymer thin film is formed using spin coating, dip coating, printing, ink jetting, or roll coating.

5. The organic thin film transistor as set forth in claim 1, wherein the fluorine-based polymer thin film has a thickness of about 10 Å~about 100 Å.

6. The organic thin film transistor as set forth in claim 1, wherein the gate insulating layer is formed of material selected from the group consisting of polyvinylphenol, polymethylmethacrylate, polyacrylate, polyvinylalcohol, $SiN_x$ (0<x<4), $SiO_2$, $Al_2O_3$, and derivatives thereof.

7. The organic thin film transistor as set forth in claim 1, wherein the organic semiconductor layer is formed of material selected from the group consisting of polythiophene, polyaniline, polyacetylene, polypyrrole, polyphenylenevinylene, and derivatives thereof.

8. The organic thin film transistor as set forth in claim 1, wherein the gate electrode and the source/drain electrodes are formed of material selected from the group consisting of gold (Au), silver (Ag), aluminum (Al), nickel (Ni), molybdenum (Mo), tungsten (XV), indium tin oxide (ITO), polythiophene, polyaniline, polyacetylene, polypyrrole, polyphenylenevinylene, and a mixture of PEDOT (polyethylenedioxythiophene) and PSS (polystyrenesulfonate).

9. The organic thin film transistor as set forth in claim 1, wherein the substrate is formed of material selected from the group consisting of glass, silicon and plastic.

10. The organic thin film transistor as set forth in claim 1, which is a bottom contact type organic thin film transistor or a top gate type organic thin film transistor.

11. The organic thin film transistor as set forth in claim 10, wherein the bottom contact type organic thin film transistor further comprises:
   a fluorine-based polymer thin film between the gate insulating layer and the organic semiconductor layer.

12. The organic thin film transistor as set forth in claim 10, wherein the top gate type organic thin film transistor further comprises:
   a fluorine-based polymer thin film between the substrate and the organic semiconductor layer.

* * * * *